(12) United States Patent
Wang

(10) Patent No.: US 6,339,264 B1
(45) Date of Patent: Jan. 15, 2002

(54) APPARATUS AND METHOD FOR FORECASTING OUTPUT VOLTAGE OF A BATTERY OF A DIGITAL CAMERA

(75) Inventor: Jack Wang, Taipei Hsien (TW)

(73) Assignee: Kinpo Electronics, Inc., Taipei (TW)

( * ) Notice: Subject to any disclaimer, the term of this patent is extended or adjusted under 35 U.S.C. 154(b) by 0 days.

(21) Appl. No.: 09/824,721

(22) Filed: Apr. 4, 2001

(51) Int. Cl.$^7$ ............................................. H01H 47/00
(52) U.S. Cl. ................................. 307/132 E; 307/130
(58) Field of Search ........................... 307/132 E, 130, 307/126, 131, 125; 348/211, 220, 231, 239

(56) References Cited

U.S. PATENT DOCUMENTS 5,077,568 A * 12/1991 Maruyama ............. 354/173.11
5,784,629 A * 7/1998 Anderson et al. ....... 395/750.08

* cited by examiner

*Primary Examiner*—Peter S. Wong
*Assistant Examiner*—Lawrence Luk
(74) *Attorney, Agent, or Firm*—Bacon & Thomas, PLLC

(57) ABSTRACT

There is disclosed an apparatus and a method for forecasting output voltage of a battery of a digital camera. A dummy load is disconnected after the digital camera is powered on. An output voltage of the battery is obtained when he dummy load is off. The dummy load is then conducted. An output voltage of the battery is obtained when the dummy load is on. An internal resistance of the battery and the output voltage of the battery in operating the power consumptive elements are determined based on the output voltages, so as to obtain the voltage drop of the output voltage of the battery caused by power consumptive elements thereby being aware of the remaining power of the battery and obtaining the maximum power supplying efficiency for the digital camera.

11 Claims, 4 Drawing Sheets

| Function<br>Output voltage of the battery | Charging circuit of the flash | Back-light driving circuit of the LCD display | Driving circuit of lens motor |
|---|---|---|---|
| 6V | 800mA | 500mA | 720mA |
| 5V | 750mA | 520mA | 720mA |
| 4V | 700mA | 650mA | 720mA |

Fig. 3

APPARATUS AND METHOD FOR FORECASTING OUTPUT VOLTAGE OF A BATTERY OF A DIGITAL CAMERA

BACKGROUND OF THE INVENTION

1. Field of the Invention

The present invention relates to the technology field of digital camera and, more particularly, to an apparatus and a method for forecasting output voltage of a battery of a digital camera.

2. Description of the Related Art

Please refer to FIG. 4. FIG. 4 shows a power supply status of a conventional digital camera. For currently digital camera design, as shown in FIG. 4, the power consumptive elements of a digital camera are: a charging circuit of the flash 91, a back-light driving circuit of LCD display 92, and a driving circuit of lens motor 93. These power consumptive elements require large power consumption. Therefore, they need three switch units 911, 921, 931 to control the supply of power, respectively. During the operation of the digital camera, if the functions of these power consumptive elements are not necessary, the related switch will be turned off to stop supplying power. The other logic circuit 94 of the digital camera comprises a digital signal processor, a ROM (read-only memory), and a RAM (random-access memory). Because of the power consumption of these elements is less and their functions are always necessary for the camera operation, there is no power supply restraint for them.

The power of the digital camera is supplied by the battery 95. After the battery 95 has been used for a while, the output voltage of the battery 95 will gradually decrease. Therefore, in order to avoid the camera from being out of function or shut down due to the insufficient output voltage of the battery, a digital camera is generally installed with a battery low detection circuit 96. When the output voltage of the battery is lower than a predetermined threshold limit value, the digital camera will generate a warning signal or sound to inform the user to replace the battery. Since, the digital camera has the aforementioned power consumptive elements, when one of the power consumptive elements works, the output voltage of the battery will be decreased differently, which result in the battery low detection circuit 96 being unable to detect the actual output voltage of the battery. Therefore, it is desired to improve the design of the battery low detection circuit of the digital camera.

SUMMARY OF THE INVENTION

The objective of the present invention is to provide an apparatus and a method for forecasting the output voltage of a battery of a digital camera, so as to obtain the voltage drop of the output voltage of the battery caused by power consumptive elements, thereby being aware of the remaining power of the battery and obtaining the maximum power supplying efficiency for the digital camera.

In accordance with one aspect of the present invention, there is provided a n apparatus for forecasting output voltage of a battery of a digital camera. The apparatus comprises: a battery voltage detection circuit connected to two output ends of a battery for outputting a dividing voltage of the battery from a dividing voltage output end; an analog-to-digital converter connected to the voltage output end for converting an analog voltage value to a digital signal to output from its output end; a dummy load connected across on the two ends of the battery; and a central processing unit connected to the output end of the analog-to-digital converter for controlling whether to conduct the dummy load or not, so as to obtain output voltages of the dummy load during off condition and on condition, respectively, and, according to the obtained output voltage, determining an internal resistance of the battery for further determining an output voltage of the battery in operating at least a power consumptive element based on an internal resistance of the battery and pre-obtained power consumption of the power consumptive element.

In accordance with another aspect of the present invention, there is provided a method for forecasting output voltage of a battery of a digital camera. The camera comprises a dummy load connected across on two ends of a battery and a plurality of power consumptive elements. The method comprises the steps of: (A) disconnecting the dummy load after the digital camera is turned on; (B) obtaining an output voltage Vdoff of the battery during the dummy load is off; (C) conducting the dummy load; (D) obtaining an output voltage Vdon of the battery during the dummy load is on; (E) determining the internal resistance of the battery by (Vdoff−Vdon)*(RD/Vdon), wherein RD is resistance value of the dummy load; and (F) determining the output voltage of the battery in operating the power consumptive elements is Vdoff−(Vdoff−Vdon)*(RD*I(x)/Vdon), wherein I(x) is pre-obtained current consumption of the power consumptive elements corresponding to the output voltage of the battery.

Other objectives, advantages, and novel features of the invention will become more apparent from the following detailed description when taken in conjunction with the accompanying drawings.

BRIEF DESCRIPTION OF THE DRAWINGS

FIG. 3 shows a table of the pre-obtained current consumption of the power consumptive elements.

DETAILED DESCRIPTION OF THE PREFERRED EMBODIMENT

Figure 1:
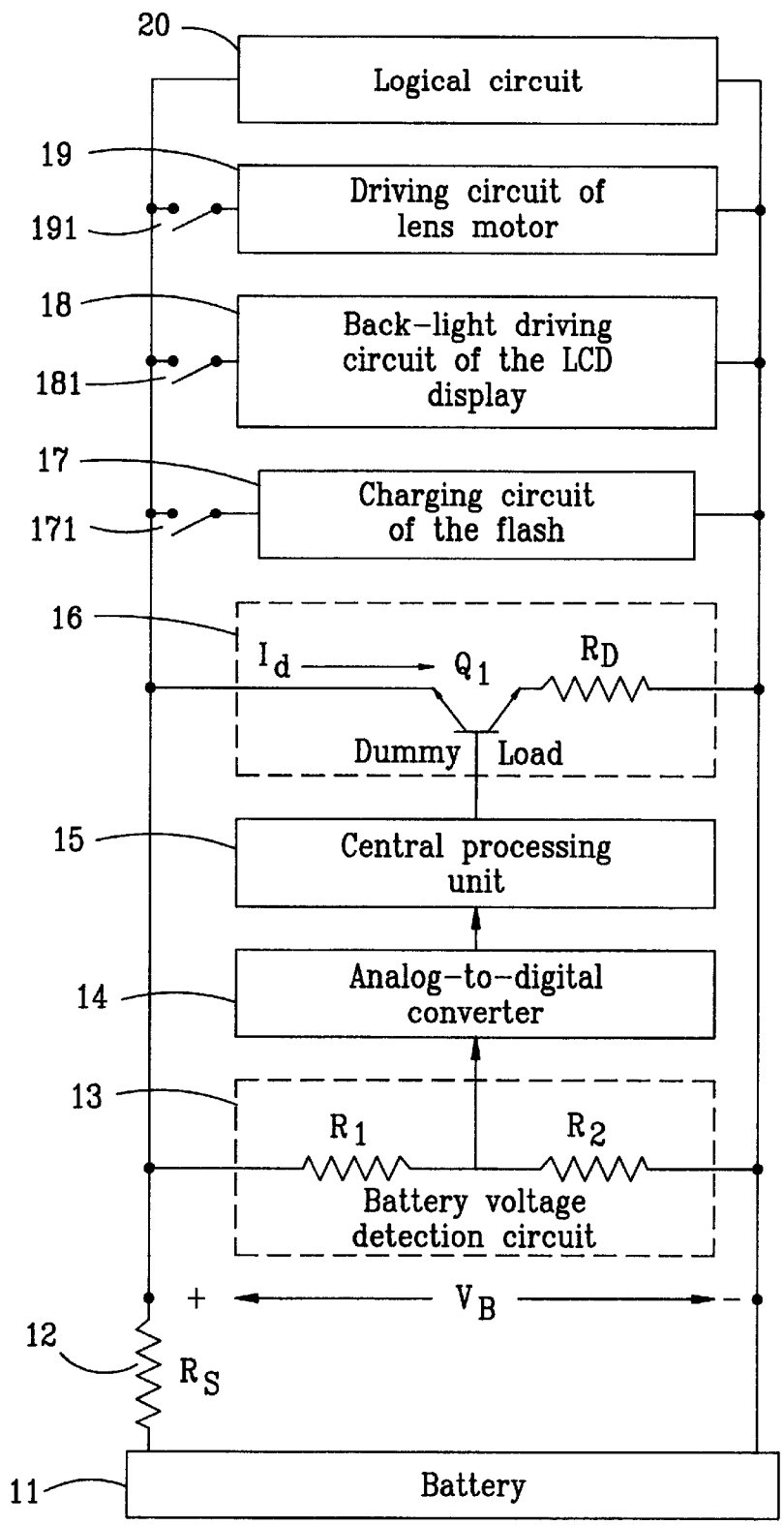
FIG. 1 is a structure diagram of the apparatus for forecasting output voltage of a battery of a digital camera of the present invention.

Please refer to FIG. 1. FIG. 1 is a structure diagram of the apparatus for forecasting output voltage of a battery of a digital camera of the present invention. Two output ends of a battery 11 with an internal resistance Rs 12 are connected a battery voltage detection circuit 13. The battery voltage detection circuit 13 is composed of a dividing voltage circuit with two resistances R1, R2 in series connection. The voltage output end of the battery voltage detection circuit 13 is connected to an analog-to-digital converter 14 for converting an analog voltage value to a digital signal and outputting from its output end. The output of the analog-to-digital converter 14 is connected to a central processing unit 15. The central processing unit 15 controls a dummy load 16 that is across on the two output ends of the battery 11. As shown in FIG. 1, the dummy load 16 is a resistance $R_D$ and a switch transistor Q1 connected in series. An output end of the central processing unit 15 is connected to the base of the switch transistor Q1 for controlling whether to conduct the dummy load 16 by turning on or off the switch transistor Q1.

The battery 11 is used for supplying power for a plurality of power consumptive elements, such as a charging circuit 17 of the flash, a back-light driving circuit 18 of the LCD display, a driving circuit 19 of the lens motor, and a logical circuit 20. The supply power for the power consumptive elements are controlled by switch units 171, 181 and 191, respectively.

The operation of the power consumptive elements will cause different voltage drop to the output voltage $V_B$ of the battery 11. The proportion of the voltage drop is decided by the internal resistance Rs 12. Therefore, in order to know the voltage drop caused by each power consumptive element, the internal resistance Rs 12 of the battery 11 needs to be obtained first. However, if the power supply system of the camera supplies power normally, the output voltage $V_B$ of the battery 11 has to be higher than a minimum output voltage $V_{TH}$. If the output voltage $V_B$ is lower than the minimum output voltage $V_{TH}$, the user will be informed that the function of the power consumptive element can not be used.

Figure 2:
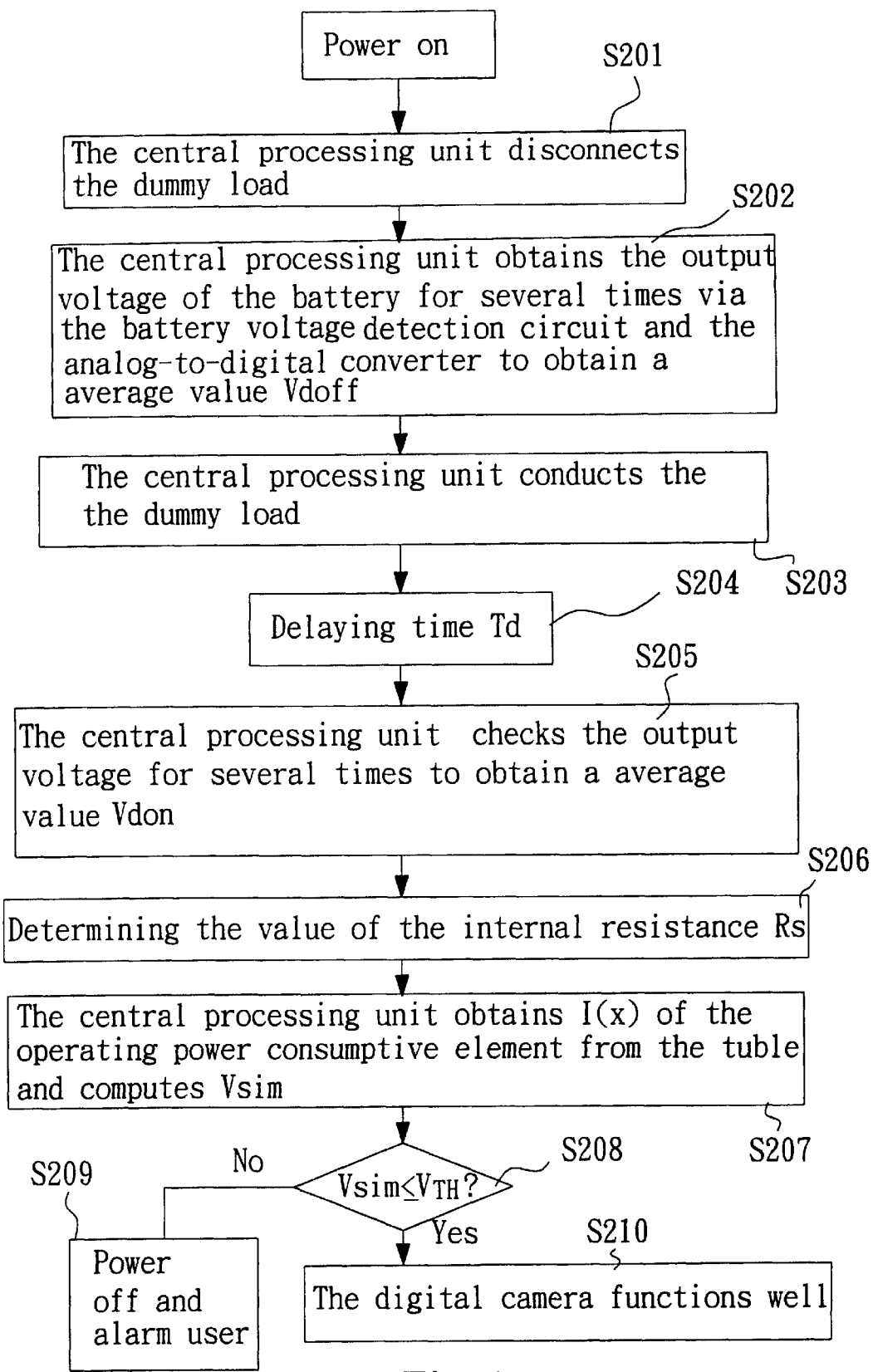
FIG. 2 is a flowchart of the method for forecasting output voltage of a battery of a digital camera.
Figure 4:
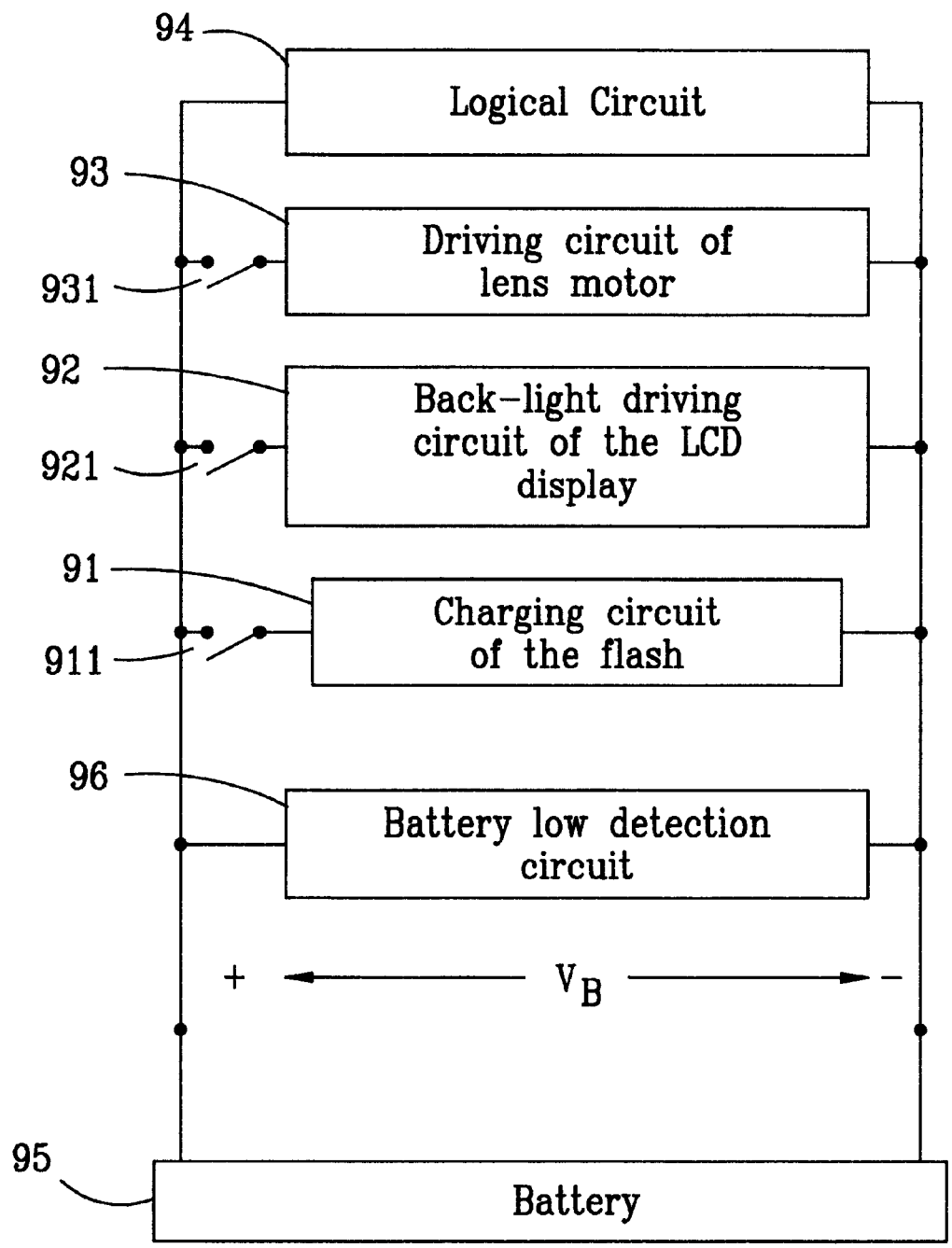
FIG. 4 shows a power supply status of a conventional digital camera.

Please refer to FIG. 2. FIG. 2 is a flowchart of the method of forecasting output voltage of a battery of a digital camera. After the power of the digital camera is turned on, the central processing unit 15 controls the switch transistor Q1 to disconnect the dummy load 16 (step 201), and indicates the output voltage of the battery is Vdoff during the dummy load is off. The central processing unit 15 obtains the output voltage of the battery $V_B$=Vdoff via the battery voltage detection circuit 13 and the analog-to-digital converter 14. In order to obtain more accurate voltage value, the central processing unit 15 may check the output voltage few more times, for example 5 times, to obtain a average value for being used as Vdoff (step 202).

In step 203, the central processing unit 15 controls the switch transistor Q1 to conduct the dummy load 16 and indicates the output voltage of the battery is Vdon during the dummy load is on. After a delaying time Td (step 204) to stabilize the electric signal, the central processing unit 15 obtains the output voltage of the battery $V_B$=Vdon via the battery voltage detection circuit 13 and the analog-to-digital converter 14. In order to obtain more accurate voltage value, the central processing unit 15 may check the output voltage few more times (ex: 5 times) to obtain a average value to be Vdon (step 205). If the current of the switch transistor Q1 is denoted as Id, the value of the internal resistance $R_s$ of the battery will be obtained by the following formula (step 206):

$$Vdoff-Vdon=R_s*Id=R_s*(Vdon-Vdoff)/R_D,$$

and $$R_s=(Vdoff-Vdon)*(R_D/Vdon). \quad (1)$$

After computing the internal resistance $R_s$ of the battery, the output voltage of the battery during the operation of the power consumptive elements can be further computed. Since each power consumptive element has different power consumption for different output voltage of the battery, the power consumption needs to be calculated first. Please refer to FIG. 3. FIG. 3 shows a list of the pre-obtained power consumption of the power consumptive elements. FIG. 3 shows the power consumption of the charging circuit 17 of the flash, the back-lighted driving circuit 18 of the LCD display, the driving circuit 19 of the lens motor, and the logical circuit 20 for three different output voltage (6V, 5V, 4V), when the digital camera is supplied power with four AAA size batteries. When the power consumption is I(x) and one of the power consumptive elements is turned on, the voltage drop will be:

$$I(x)*R_s=I(x)*(Vdoff-Vdon)*(R_D/Vdon). \quad (2)$$

Then, replacing $R_s$ by the result of formula (1), the forecasting value of the output voltage of the battery for that power consumptive element is:

$$Vsim=Vdoff-(Vdoff-Vdon)*(R_D*I(x)/Vdon) \quad (3).$$

The pre-obtained current consumption I(x) of the power consumptive elements are recorded in a table stored in the central processing unit 15 or an external non-volatile memory. Furthermore, the formulas (1), (2) and (3) can be implemented in a program and executed by the central processing unit 15. Therefore, the central processing unit 15 obtains I(x) of the operating power consumptive element from the table and computes Vsim (the step 207 in FIG. 2). The step 208 is to detect whether the output voltage Vsim of the battery during operation of the power consumptive element is lower than the minimum input voltage $V_{TH}$ for enabling the camera to function normally, if it is too low, the digital camera will be turned off and alarms user (step 209); if it is not, the digital camera can function well (step 210).

According to the above-mentioned description, the present invention is able obtain the voltage drop of the output voltage of the battery caused by power consumptive element to know remaining power of the battery, thereby obtaining the maximum power supplying efficiency for the digital camera.

Although the present invention has been explained in relation to its preferred embodiment, it is to be understood that many other possible modifications and variations can be made without departing from the spirit and scope of the invention as hereinafter claimed.

What is claimed is:

1. An apparatus for forecasting output voltage of a battery of a digital camera, the apparatus comprising:
   a battery voltage detection circuit connected to two output ends of a battery for outputting a dividing voltage of the battery from a dividing voltage output end;
   an analog-to-digital converter connected to the voltage output end for converting an analog voltage value to a digital signal to output from its output end;
   a dummy load connected across on the two ends of the battery; and
   a central processing unit connected to the output end of the analog-to-digital converter for controlling whether to conduct the dummy load or not, so as to obtain output voltages of the dummy load during off condition and on condition, respectively, and, according to the obtained output voltage, determining an internal resistance of the battery for further determining an output voltage of the battery in operating at least a power consumptive element based on an internal resistance of the battery and pre-obtained power consumption of the power consumptive element.

2. The apparatus as claimed in claim 1, wherein the battery voltage detection circuit is composed of a dividing voltage circuit with two resistances connected in series.

3. The apparatus as claimed in claim 1, wherein the dummy load is a resistance and a switch transistor connected in series, the central processing unit being connected to the base of the switch transistor for controlling the switch transistor to conduct the dummy load.

4. The apparatus as claimed in claim 1, wherein the central processing unit turns off the dummy load first, after the digital camera is powered on, to obtain the output voltage Vdoff of the battery during the dummy load is off, and then conducts the dummy load to obtain the output voltage Vdon of the battery during the dummy load is on.

5. The apparatus as claimed in claim 4, wherein the internal resistance of the battery obtained by the central processing unit is (Vdoff−Vdon)*($R_D$/Vdon), wherein $R_D$ is resistance value of the dummy load.

6. The apparatus as claimed in claim 5, wherein the output voltage of the battery in operating the power consumptive element obtained by the central processing unit is Vdoff−(Vdoff−Vdon)*($R_D$*I(x)/Vdon), wherein I(x) is pre-obtained current consumption of the power consumptive element corresponding to the output voltage of the battery.

7. The apparatus as claimed in claim 6, wherein the pre-obtained current consumption of the power consumptive elements is stored in a non-volatile memory as a table.

8. A method for forecasting output voltage of a battery of a digital camera, the camera comprising a dummy load connected across on two ends of a battery and a plurality of power consumptive elements, the method comprising the steps of:

(A) disconnecting the dummy load after the digital camera is turned on;

(B) obtaining an output voltage Vdoff of the battery during the dummy load is off;

(C) conducting the dummy load;

(D) obtaining an output voltage Vdon of the battery during the dummy load is on;

(E) determining the internal resistance of the battery by (Vdoff−Vdon)*(RD/Vdon), wherein RD is resistance value of the dummy load; and (F) determining the output voltage of the battery in operating the power consumptive elements is Vdoff−(Vdoff−Vdon)*(RD*I(x)/Vdon), wherein I(x) is pre-obtained current consumption of the power consumptive elements corresponding to the output voltage of the battery.

9. The method as claimed in claim 8, filter comprising a step between steps (C) and (D) for delaying a period of time to stabilize the electrical signal.

10. The method as claimed in claim 8, wherein in the step (F), the pre-obtained current consumption of the power consumptive elements are stored as a table.

11. The method as claimed in claim 8, further comprising a step (G) for detecting whether the output voltage of the battery in operating the power consumptive element is lower than the minimum input voltage capable of enabling the camera to function normally, and if it is too low, the power consumptive element is powered off and the user is alarmed, otherwise, the camera can function well.

* * * * *